United States Patent [19]
Yamagishi et al.

[11] Patent Number: 6,060,763
[45] Date of Patent: May 9, 2000

[54] SEMICONDUCTOR DEVICE AND METHOD FOR PRODUCING SAME

[75] Inventors: Kazuo Yamagishi; Akihiro Shimomura; Hirohiko Uno, all of Shiga, Japan

[73] Assignee: NEC Corporation, Tokyo, Japan

[21] Appl. No.: 08/970,189

[22] Filed: Nov. 14, 1997

[51] Int. Cl.[7] .................................................. H01L 27/082
[52] U.S. Cl. ........................... 257/577; 257/487; 257/603
[58] Field of Search .................................... 257/577, 551, 257/603, 487

[56] References Cited

FOREIGN PATENT DOCUMENTS

| 57-190357 | 11/1982 | Japan | 257/577 |
|---|---|---|---|
| 59-014670 | 1/1984 | Japan | 257/577 |
| 7-70742 | 7/1995 | Japan . | |

OTHER PUBLICATIONS

Abstract for JP Application No. 5–259479 filed Oct. 8, 1993.

*Primary Examiner*—Mark V. Prenty
*Attorney, Agent, or Firm*—Hutchins, Wheeler & Dittmar, PC

[57] ABSTRACT

A semiconductor device has formed onto the surface of a collector region 12 of a semiconductor substrate 11 of one conductivity type with a base region 13 of a different conductivity type, an emitter region 16 of the one conductivity type formed on a surface within the base region 13, and a base electrode 18 and emitter electrode 17 which are formed by opening windows in the base and emitter regions 13, 16. In this semiconductor device, a zener region 15 of an impurity concentration of the one conductivity type that is higher than that of the collector region 12 is provided in a through-passage region 14 which passes through to the bottom part from the surface of the base region 13, and on this zener region is formed an insulating film 21 of a thickness such that the zener region surface does not invert with the withstand voltage between the base region 13 and the zener region 15, the semiconductor device being covered at the base electrode 18 or emitter electrode 17 on the insulating film 21 on the zener region.

17 Claims, 5 Drawing Sheets

SEMICONDUCTOR DEVICE AND METHOD FOR PRODUCING SAME

BACKGROUND OF THE INVENTION

1. Field of the Invention

The present invention relates to a semiconductor device, and more specifically to a transistor that includes a zener diode that prevents surge destruction and to a manufacturing method therefor.

2. Description of the Related Art

A transistor of the past which included a zener diode, is shown in FIG. 11, in which the reference numeral 1 denotes an $n^+$ type semiconductor substrate made of silicon, 2 is an $n^-$ type silicon region, 3 is a p-type base region, 4 is an $n^+$ type collector surface region, 5 is an $n^+$ type emitter region, 6 is an emitter electrode, 7 is a base electrode, and 8 is an oxide film.

In the above device, a zener diode is formed by the p-type base region 3 as an anode and the $n^+$ type collector surface region 4 as a cathode, and an NPN transistor is formed by the $n^+$ type emitter region 5, the p-type base region 3, and the n-type collector region 2.

In the above-described semiconductor device, by applying a positive voltage to the collector region 2 and a negative voltage to the base electrode 7, there arises the problem of a lateral broadening of a depletion layer formed by the influence of free ions in the oxide film 8 at the surface of the high-concentration collector surface region 4 and free ions within the outer resin over the high-concentration collector surface region, this in turn influencing the breakdown voltage (zener voltage) of the zener diode. To reduce the influence of the free ions, if the high-concentration collector surface region is covered at the base electrode by an oxide film, there is the problem of instability of the withstand voltage, because of the relationship between the base electrode and the extension length toward the high-concentration collector surface region.

SUMMARY OF THE INVENTION

The present invention was proposed as a solution to the above-noted problems and is a semiconductor device which has formed onto the surface of a collector region of a semiconductor substrate of one conductivity type a base region of a different conductivity type, an emitter region of the one conductivity type formed on a surface within the base region, and a base electrode and emitter electrode which are formed by opening windows for the collector in the base and emitter regions. In this semiconductor device, a zener region of an impurity concentration of the one conductivity type that is higher than that of the collector is provided in a through-passage region which passes through to the bottom part from the surface of the above-noted base, in the region or the above-noted electrode within this through-passage region, and minimally on this zener region is formed an insulating film of a thickness such that the zener region surface does not invert with the withstand voltage between the base region and the zener region, the semiconductor device being covered at the base electrode oremitter electrode via the insulating film on this zener region. In this manner, by surrounding the zener region of the one conductivity type of a zener diode by the base region of the other type of conductivity, a guard-ring effect is achieved, the thickness of the insulating film at the surface part of the zener region is made at least the thickness at which an inversion layer is not formed in the zener region at below the desired zener withstand voltage, and by covering the insulating film by the base electrode or the emitter electrode, it is possible to obtain a stable zener withstand voltage.

In addition to the above-noted configuration, the present invention provides a semiconductor device in which a through-passage region is formed along the region of the boundary between the base region and the collector region so as to surround the emitter region. Because the through-passage region is formed in this manner in the shape of a ring with a zener diode formed thereat, the base region outside the zener region forms a guard-ring, the resultant guard-ring effect serving to increase the withstand voltage. It is therefore possible to obtain a stable zener withstand voltage.

In addition to the above-noted configuration, the present invention provides a semiconductor in which a through-passage region is formed so as to divide the direction along the boundary between the surfaces of the base region and the collector region into a plurality of parts. Because the through-passage region is divided and formed in the shape of a ring with a zener diode formed thereat, the zener region is surrounded by the same diffusion base region, and it is possible to obtain a stable zener withstand voltage.

The present invention also provides a semiconductor device which has formed onto the surface of a collector region of a semiconductor substrate of one conductivity type a base region of a different conductivity type, an emitter region of the one conductivity type formed on a surface within the base region, and a base electrode and emitter electrode which are formed by opening windows for the collector in the base and emitter regions. In the base region, a through-passage region is formed along the region of the boundary between the base region and the collector region so as to surround the emitter region and so as to extend from the surface to the bottom part, a zener region being formed in this through-passage region which includes an impurity concentration of the one conductivity type that is higher than that of the semiconductor substrate, and minimally on this zener region is formed an insulating film of a thickness such that the zener region surface does not invert with the withstand voltage between the base region and the zener region, the base region inside the zener region and the base region outside being electrically connected at the base electrode on the insulating film on top of the zener region. By making the thickness of the insulating film at least the thickness at which an inversion layer is not formed in the zener region at below the desired zener withstand voltage, and by electrically connecting the base region inside the zener region with the base region outside the zener region at the base electrode on the intervening insulation film on the zener region, the zener region is surrounded by the base-region potential, and it is possible to obtain a stable zener withstand voltage.

The present invention also provides a semiconductor device in which a zener region is formed so as to have a depth that is shallower than the base region. In this case, although the breakdown usually occurs first at boundary between the base region lower surface and the corner of through-passage region, because the collector region concentration in this region is low, the breakdown occurs in the zener region, and it is possible to obtain a stable zener withstand voltage.

The present invention further provides a semiconductor device in which an insulating film is formed by a silicon oxide film and a phosphorus glass layer disposed thereover. By forming the "phosphorus glass" layer over the silicon oxide film, there is a strong effect of trapping mobile ions, thereby enabling the achievement of a stable zener withstand voltage.

The present invention also provides a semiconductor device in which the width of the through-passage region is established so that the depletion layers that extends from the base region bottom parts that surround the through-passage region do not make mutual contact. Because the width of the through-passage region is wider than the depletion layer that extends from the base region that surrounds the through-passage region, there is no mutual overlapping between the depletion layers of both sides. Additionally, the depletion layer inside the ring-shaped zener region does not run into the electrically separate base region outside the ring-shaped zener region. As a result, breakdown occurs in the zener region, and it is possible to obtain a stable zener withstand voltage.

A method for manufacturing a semiconductor device according to the present invention has the following steps.

(1) a first step of forming a collector region of one type of conductivity by means of epitaxial growth on a semiconductor substrate of this type of conductivity, (2) a second step of injecting a first type of impurity into a surface of the collector, followed by forming a base region having another type of conductivity, and forming a through-passage region within the base region, along a region near a boundary between the base region and the collector region, into which through-passage region this impurity is not diffused, (3) a third step of injecting ions of a second impurity in the through-passage region so as to form a zener region of the above-noted first type of conductivity having a concentration that is higher than that of the collector region, (4) a fourth step of forming an insulating layer on top of the base region and the zener region, (5) a fifth step of diffusing phosphorus in the surface of the base region so as to form an emitter region, and forming a phosphorus glass layer on top of the insulating layer, and (6) a sixth step of forming a base electrode and an emitter electrode in the base region and the emitter region.

In another method for manufacturing a semiconductor device according to the present invention, in addition to the above-noted six steps, the zener region is covered by a base electrode or an emitter electrode.

In yet another method for manufacturing a semiconductor device according to the present invention, in addition to the above-noted six steps, the depth of the zener region is shallower than the depth of base region.

In yet another method for manufacturing a semiconductor device according to the present invention, the through-passage region is divided into multiple parts so as to be divided in a direction along the boundary.

Yet another method for manufacturing a semiconductor device according to the present invention has the following steps.

(1) a first step of forming a collector region of one type of conductivity by means of epitaxial growth on a semiconductor substrate of this type of conductivity, (2) a second step of injecting a first type of impurity into a surface of the collector, followed by forming a base region having another type of conductivity, and forming a through-passage region within the base region, along a region near a boundary between the base region and the collector region, (3) a third step of injecting ions of a second impurity in the through-passage region so as to form a zener region of the above-noted first type of conductivity having a concentration that is higher than that of the collector region, a fourth step of forming an insulating layer on top of the base region and the zener region;

a fifth step of diffusing phosphorus in the surface of the base region so as to form an emitter region, and forming a phosphorus glass layer on top of the insulating layer; and a sixth step of forming a base electrode in the base region and the emitter region, the base electrode electrically connecting an inner side base region and an outer side base region with respect to the zener region, via an intervening insulating film.

DETAILED DESCRIPTION OF THE INVENTION

Preferred embodiments will be explained in detail, with reference being made to the relevant accompanying drawings.

Figure 1:
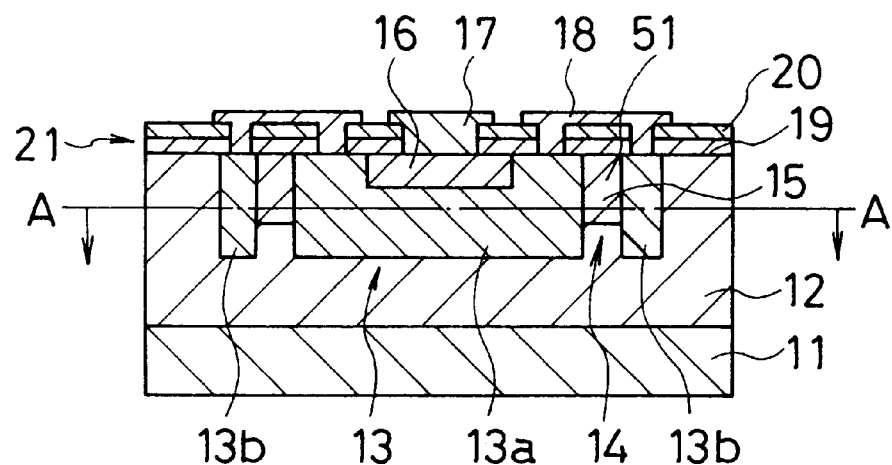
FIG. 1 is a cross-sectional view of the first embodiment of a semiconductor device according to the present invention.
Figure 2:
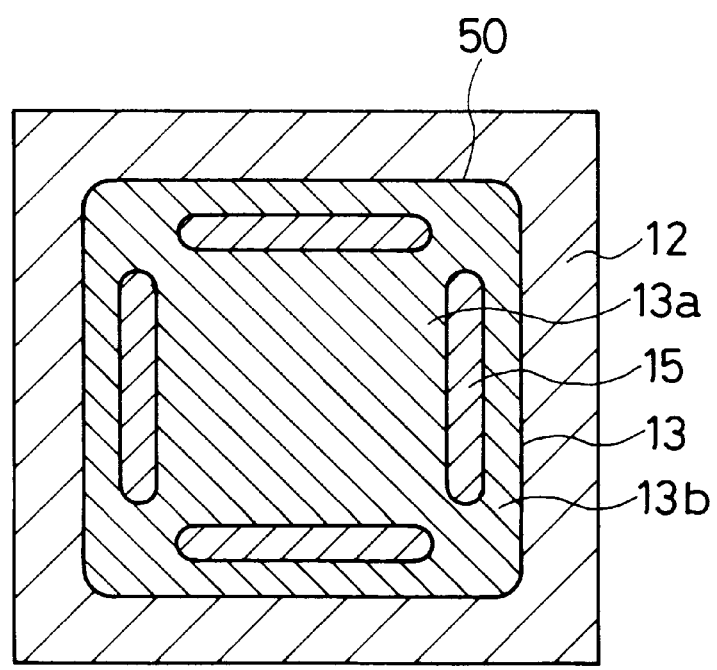
FIG. 2 is a cross-sectional view along the line A—A in Fig. 1.

The first embodiment of a semiconductor device according to the present invention will be described with reference to FIG. 1, which is a cross-sectional view thereof, and FIG. 2, which is a cross-sectional view along the line A—A which is shown in FIG. 1.

In FIG. 1, the reference numeral 11 denotes a substrate of a given conductivity, which is an $n^+$ type semiconductor substrate, 12 is an n-type collector region, 13 is a base region of another conductivity, which is a p-type base region, 14 is a through-passage region, 15 is an n-type zener region. 16 is an $n^+$ type emitter region, 17 is an emitter electrode. 18 is a base electrode, 19 is a silicon oxide film, 20 is a phosphorus glass layer, 21 is an insulating layer, which is the combination of the silicon oxide film 19 and the phosphorus glass layer 20 formed thereover.

The structure of the above-noted semiconductor device will now be described, with comments about the manufacturing method therefor.

An epitaxy layer is grown on the main surface of the n+ type semiconductor substrate 11, thereby forming the n-type collector region 12. Photolithography is used to implant boron ions into the surface of the collector region 12, after which thermal diffusion is used to form a p-type base region 13 that is a square with rounded corners, although it is not necessary for the corners of the base region 13 to be rounded. It is also possible for the region to be either circular or elliptical. Within the base region 13, a through-passage region 14 is formed along the region of the boundary 50 between the base region 13 and the collector 12, from the surface of the base region 13 extending to the bottom surface, into which boron is not diffused. The plan-view shape of the through-passage region 14 is divided into narrow rectangles with rounded corners, there being four such shapes. The division of the through-passage region 14 is not limited to division into four parts; it can be divided into any number of parts. Also, it is not necessary for the corners thereof to be rounded, and rather than rectangular the shape can be either round or elliptical. However, it is necessary to divide the divided zener region 15 so as to have the same withstand voltage. Then, Photolithography is used to implant phosphorus ions into this through-passage region 14, after which thermal diffusion is done to same the same shallow depth as the base region 13, thereby forming an n-type zener region 15 having a concentration that is higher than the collector region 12. Therefore, the zener region 15 is formed at the region 51 at the base and emitter electrode formation side of the through-passage region 14. Therefore, the n-type through-passage region 14 remains under the zener region 15.

Next, the silicon oxide film 19 is formed over the entire surface, using thermal oxidation. This can also be done using a CVD process. Additionally, instead of oxidation, nitriding can be done. Then photolithography isused to form an emitter region 16 by phosphorus diffusion over a part of the surface of the inside base region 13a which is inside the zener region 15. This results in the zener region 15 surrounding the emitter region 16 via the intervening inside base region 13a. When doing this, a phosphorus glass layer 20 is formed on the silicon oxide film 19. Additionally, if necessary, it is possible to laminate the phosphorus glass layer 20 using a CVD process to make it thick.

Then, photolithography and aluminum deposition are used to form the base electrode 18 and the emitter electrode 17 in the base region 13 and the emitter region 16, respectively. When doing this, the top of the zener region 15 is covered by the base electrode 18 on an intervening insulating film 21, the inside base region 13a within the zener region 15 and the outer base region 13b outside the zener region 15 being electrically connected at the base electrode 18. Because the inner base region 13a between the divided zener region 15 is electrically connected to the outer base region 13b, it is not absolutely necessary to connect the outer base region 13b to the base electrode 18. Therefore, the top of the outer base region 13b is also covered by the base electrode 18 on the intervening insulating film 21. In either case, it is possible to form the base electrode 18 so as to go beyond the outer base region 13b and extend to above the insulating film 21 of the collector region 12. When causing the transistor to operate, because the emitter region 16 and the base region 13 are at the same potential VBE, that is, the base electrode 18 can similarly be at the same potential as the emitter electrode 17, and it is possible to cover the top of the zener region 15 with the emitter electrode 17 on the insulating film 21, and it is possible to cover beyond the outer base region 13b, extending the covering up to top of the insulating film 21 of the collector region 12.

In the above-described structure, the emitter region 16, the base region 13, and the collector region 12 form an NPN transistor having corresponding emitter, base, and collector, the zener region 15 and base region 13 serving as the cathode and anode, respectively, of a zener diode between the collector and base thereof.

In this structure, the thickness of the insulating film 21 is made at least as large as the thickness at which there is no inversion layer 45 formed on the surface of the zener region 15 under the insulating film 21 at the desired withstand voltage, that is, at the voltage at which breakdown occurs in the zener region 15.

Under these conditions, the thickness of the insulating film 21 is approximately given by the following equation, which is taken from the general theory of an MOS structure.

$$tox = (VZ - Vfb - \phi s(inv)) * (\epsilon ox * \epsilon o)/(q * Nd * Ld)$$

In the above equation:

tox: thickness of insulating film

VZ: Withstand voltage (zener voltage) between the base region 13 and the zener region 15

Vfb: Flat-band voltage $\phi$s(inv): Surface potential at the time of inversion $\epsilon$ox: Relative dielectric constant of the insulating film $\epsilon$o: Dielectric constant of a vacuum q: Charge of an electron Nd: Donor concentration in the zener region Ld: Width of the depletion layer in the vertical direction Using the above-noted relationship, the thickness required of the insulating film can be set in accordance with the desired zener voltage. For example, if the desired withstand voltage between the base region 13 and the zener region 15 is 100 V, it is necessary to make the thickness of the insulating film at least 1.5 $\mu$m.

When a phosphorus glass layer 20 is formed on top of the silicon oxide film 19, because mobile ions are trapped and there is a strong effect of preventing the influence of mobile ions, it is possible to obtain a stable zener withstand voltage. When doing this, it is desirable that the thickness of the phosphorus glass layer 20 is made greater than the thickness of the silicon oxide film 19.

The features of the above-noted semiconductor device structure and the influence on the characteristics and the like are described below, with reference being made to FIG. 6 through FIG. 10.

Figure 6:
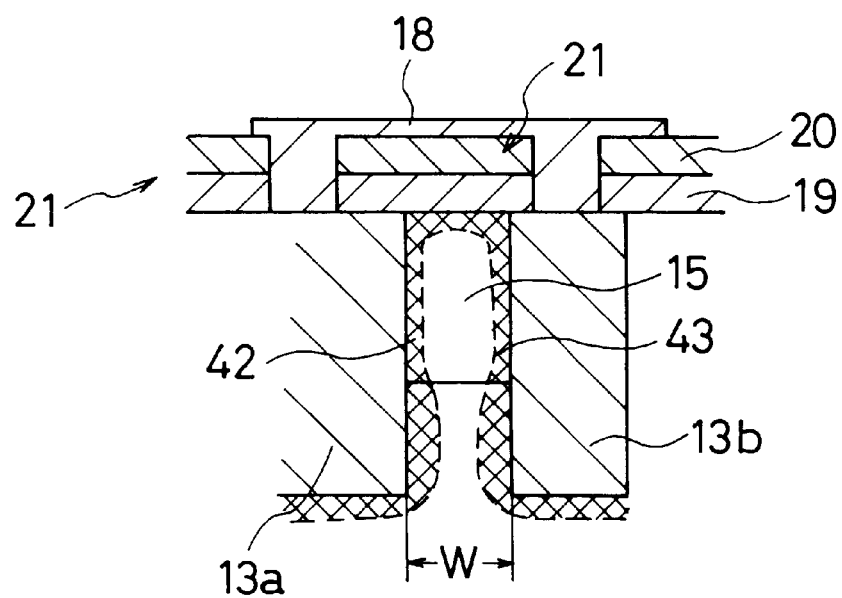
FIG. 6 is a cross-sectional view which shows the condition in which a depletion layer is formed.
Figure 9:
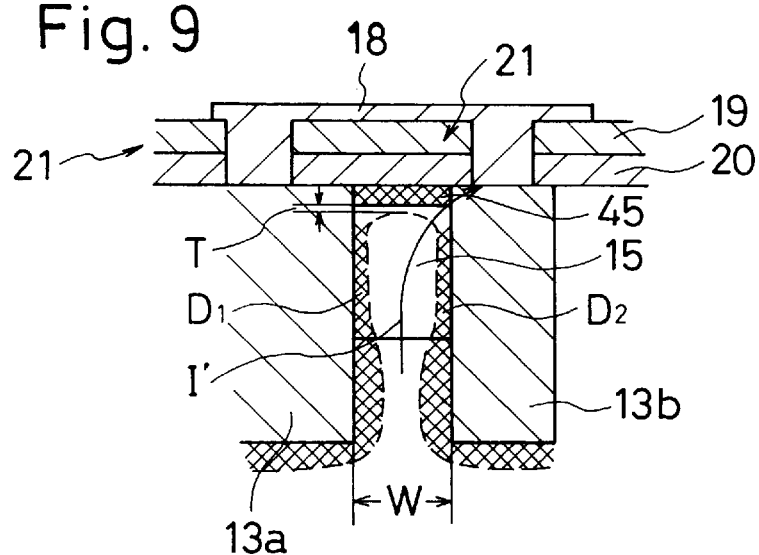
FIG. 9 is a drawing which shows the breakdown when an inversion layer is formed.
Figure 10:
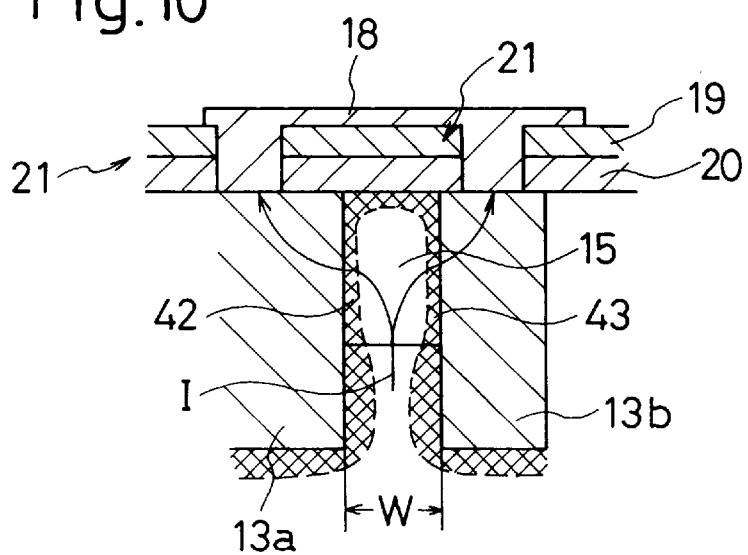
FIG. 10 is a drawing which shows the breakdown when an inversion layer is not formed.
Figure 11:
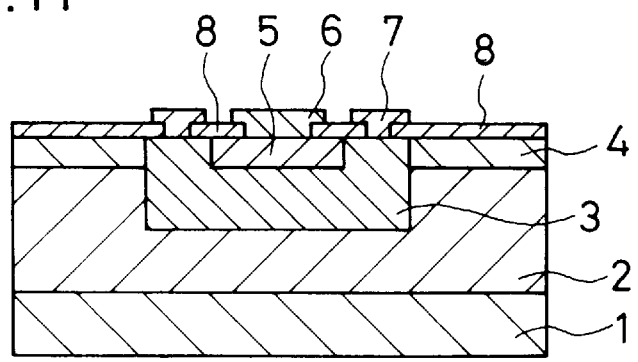
FIG. 11 is a cross-sectional view of a semiconductor device of the prior art.

The depth of the zener region 15 is made either the same as or shallower than that of the base region 13. If the zener region 15 depth is greater than the base region 13, the withstand voltage between the collector region 12 and the emitter region 16 is reduced, thereby reducing the capacity to tolerate an inductive load. As shown in FIG. 6, the width W of the zener region 15 is designed so that there is no mutual overlapping between depletion layers 42 and 43 which extend from the outer base region 13b and the inner base region 13a. If smaller the impurity concentration is, the greater is the extension of the depletion layers 42 and 43. Thus, because the zener region 15 is formed by diffusion, the impurity concentration is smaller the farther down you look within the zener region 15. Therefore, the overlapping of the depletion layers 42 and 43 starts at the lower end of the through-passage region 14. If there is mutual overlapping between the depletion layers 42 and 43, breakdown occurs not in the zener region 15 above that region, but rather at the boundary of the base region 13 lower surface and the through-passage region 14 corner. If breakdown occurs in this region, surge damage tends to occur(Fig.9). If excessive broadening of the width W is done so that the depletion layers do not overlap, the pellet size of the semiconductor device increases.

The base electrode 18 can be formed so as to exceed beyond the boundary between the outer periphery of the outer base region 13b and the collector region 12. When doing this, a depletion region extends beneath the insulating film 21 of the collector region 12 outside of the outer base region 12b, so that even if, due to variations in the length of the base region 18 extending on the collector region 12, the withstand voltage becomes unstable, the impurity concentration of the zener region 15 can be made such that the zener region 15 withstand voltage is lower than the lowest withstand voltage under that condition.

Figure 7:
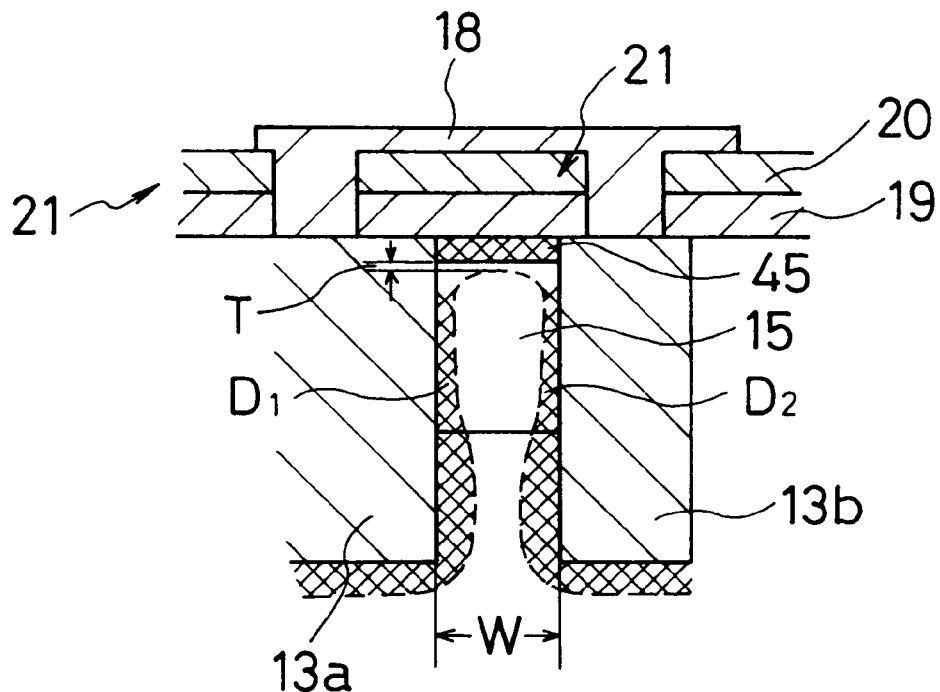
FIG. 7 is a cross-sectional view which shows the condition in which an inversion layer is formed.

Additionally, the zener region 15, the insulating film 21, and the base region 18 form what is known as a MOS structure, and in the case in which the voltage is low, depletion regions 42 and 43 will be formed in response to the voltage, within the zener region 15, as shown in FIG. 6. When the voltage is low, however, if the insulating film 21 is thin, the surface of the zener region 15 will exhibit inversion before the reaching the zener withstand voltage, and an inversion layer 45 is formed (FIG. 7). The depletion layer part T of the zener region 15, which establishes the zener withstand voltage does not extend, regardless of the n-type impurity concentration of the zener region 15, breakdown occurring a region having the lowest withstand voltage. As a result, for a given concentration, the zener withstand voltage becomes high, and it is not possible to achieve the prescribed zener withstand voltage. However, by forming the insulating film 21 with a thickness such that, at a voltage lower than prescribed zener withstand voltage, there is no inversion of the surface of the zener region 15, breakdown occurs in the depletion layer 45 which is established by the n-type impurity concentration in the zener region under the insulating film 21, so that it is possible to control the zener withstand voltage. As a result, it is possible to obtain a stable zener withstand voltage. The relationship between the withstand voltage and the impurity concentration of the zener region 15 for the case in which an inversion layer 45 occurs and the case in which an inversion layer does not occur is shown in FIG. 3.

Figure 3:
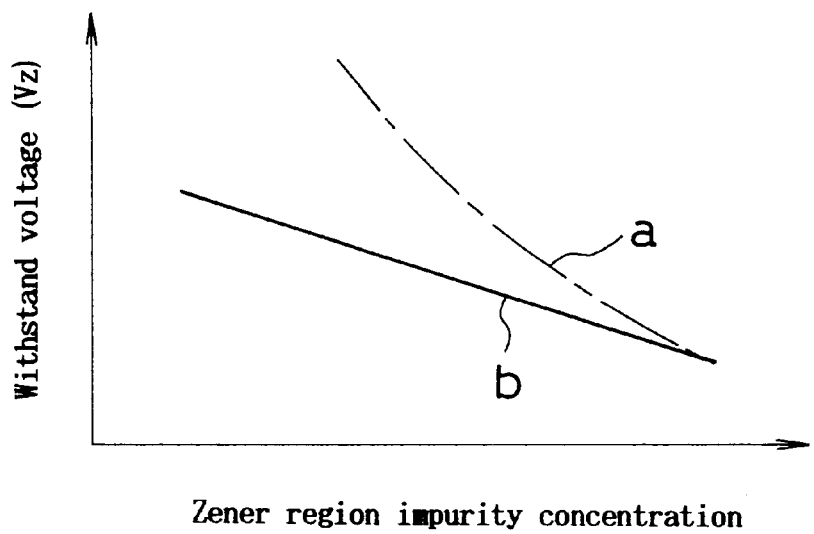
FIG. 3 is a drawing which shows the relationship between the withstand voltage and the zener region impurity concentration.

As shown in FIG. 3, with a structure in which the insulating film 21 is thin, because there is a large change in the withstand voltage with respect to a change in the impurity concentration in the zener region, it is difficult to control the withstand voltage in the region in which the withstand voltage is high. With the present invention, which has a construction having a thick insulating film, even if the withstand voltage is high, because the change in withstand voltage with respect to a change in the impurity concentration in the zener region is gradual, it is easy to control the withstand voltage by means of the concentration. By virtue of the above-noted effect, in the case in which a reverse voltage is applied between the collector and the base, because a zener region is formed so as to surround the base region, the depletion layer 45 is formed uniformly, a change in the zener withstand voltage is suppressed, and it is possible to obtain a transistor having a stable withstand voltage.

Figure 8:
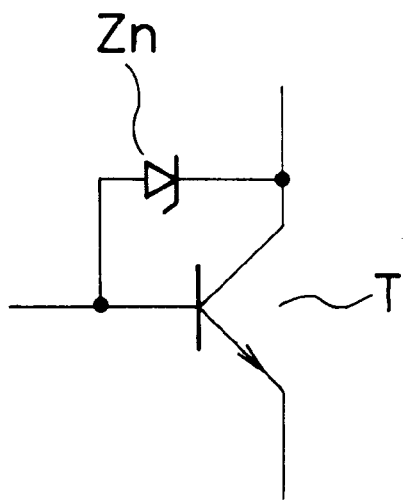
FIG. 8 is an equivalent circuit diagram of an apparatus according to the present invention.

FIG. 8 is an equivalent circuit diagram of the device of the present invention, and FIG. 9 is a drawing which shows the condition in which a surge current I flows in the zener region 15 when breakdown occurs.

Although in the foregoing descriptions, the given conductivity was taken as n type and the other conductivity was taken as p type for the case of an NPN transistor, application is also possible to the case of a PNP transistor in which the given conductivity is p type and the other conductivity is n type.

Figure 4:
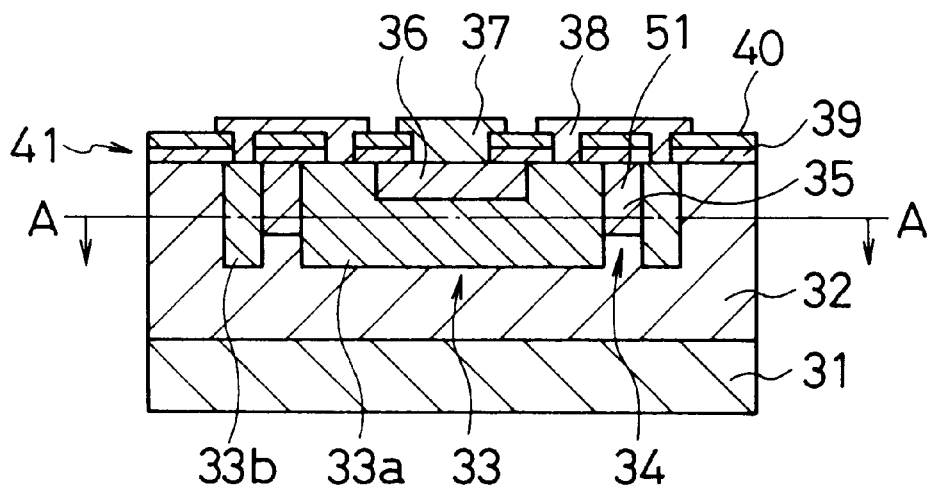
FIG. 4 is a cross-sectional view of the second embodiment of a semiconductor device according to the present invention.
Figure 5:
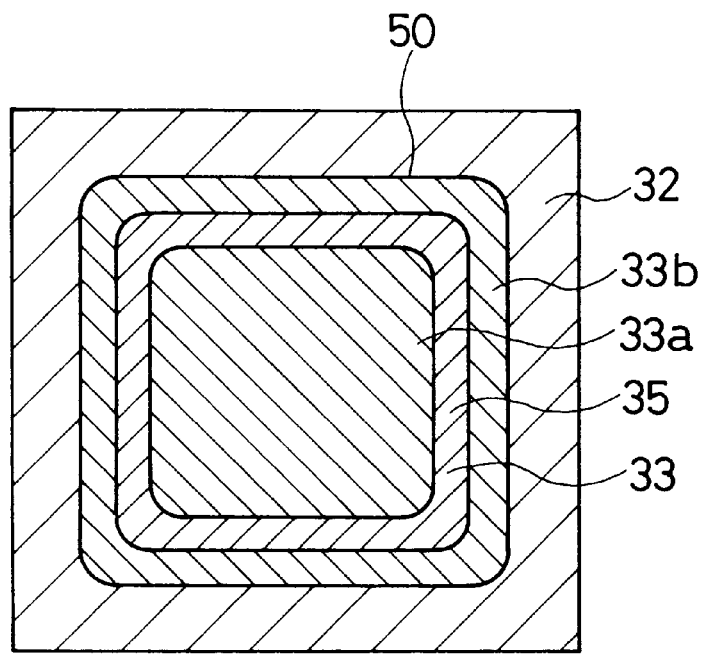
FIG. 5 is a cross-sectional view along the line A—A in FIG. 4.

The second embodiment of a semiconductor device according to the present invention will now be described with reference to FIG. 4, which is a cross-sectional view thereof, and FIG. 5, which is a cross-sectional view along the line A—A which is shown in FIG. 4.

In FIG. 4, the reference numeral 31 denotes a substrate of a given conductivity, which is an $n^+$ type semiconductor substrate, 32 is a n-type collector region, 33 is a base region of another conductivity, which is a p-type base region, 34 is a through-passage region, 35 is an n-type zener region, 36 is an $n^+$ type emitter region, 37 is an emitter electrode, 38 is a base electrode, 39 is a silicon oxide film, 40 is a phosphorus glass layer, 41 is an insulating film, which is the combination of the silicon oxide film 39 and the phosphorus glass layer 40.

The structure the above-noted semiconductor device will now be described, with comments about the manufacturing method therefor.

An epitaxy layer is grown on the main surface of the $n^+$ type semiconductor substrate 31, thereby forming the n-type collector region 32. Photolithography is used to implant boron ions into the surface of the collector region 32, after which thermal diffusion is used to form a p-type base region 33 that is a square with rounded corners. In the base region 33, a through-passage region 14 is formed along the region of the surface boundary between the base region 33 and the collector region 12, from the surface of the base region 33 extending to the bottom surface, into which boron is not diffused. Both the base region 33 and the through-passage region 34 can be squares with rounded corners, and these can also be either circular or elliptical. Then, photolithography is used to implant phosphorus ions into this through-passage region 34, after which thermal diffusion is done to a shallower depth than the base region 33, thereby forming an n-type zener region 35 having a concentration that is higher than the collector region 32. Therefore, the n-type through-passage region 34 remains under the zener region 35.

Next, the silicon oxide film 39 is formed over the entire surface, using thermal oxidation. This can also be done using a CVD process. Additionally, instead of oxidation nitriding can be done. Then photolithography is used to form an emitter region 36 by phosphorus diffusion over a part of the surface of the inside base region 33a which is inside the zener region 35. This results in the zener region 35 surrounding the emitter region 36 via the intervening inside base region 33a. When doing this, a phosphorus glass layer 40 is formed on the silicon oxide film 39. Additionally, if necessary, it is possible to laminate the phosphorus glass layer 40 using a CVD process to make it thick.

Then, photolithography and aluminum deposition are used to form the base electrode 38 and the emitter electrode 37 in the base region 33 and the emitter region 36, respectively. When doing this, the top of the zener region 35 is covered by the base electrode 38 via an intervening insulating film 41, the inside base region 33a within the zener region 35 and the outer base region 33b outside the zener region 35 being electrically connected at the base electrode 38. Because the inner base region 33a between the divided zener region 15 is electrically connected to the outer base region 13b, it is not absolutely necessary to connect the outer base region 33b to the base electrode 38. Therefore, the top of the outer base region 33b is also covered by the base electrode 38 on the intervening insulating film 41. In either case, it is possible to form the base electrode 38 so as to go beyond the outer base region 33b and extend to above the insulating film 41 of the collector region 32. When causing the transistor to operate, because the emitter region 46 and the base region 33 are at the same potential VBE, the base electrode 38 can similarly be at the same potential as the emitter electrode 37, and it is possible to cover the top of the zener region 35 on the insulating film 41, and it is possible to cover beyond the outer base region 33b, extending the covering up to top of the insulating film 41 of the collector region 32. In the above-described structure, the emitter region 16, the base region 13, and the collector region 12 form an NPN transistor having corresponding emitter, base, and collector, the zener region 15 and base region 13 serving as the cathode and anode, respectively, of a zener diode between the collector and base thereof.

In the above-described structure, the emitter region 36, the base region 33, and the collector region 32 form an NPN transistor having corresponding emitter, base, and collector, the zener region 35 and base region 33 serving as the cathode and anode, respectively, of a zener diode between the collector and base thereof.

In this structure, the thickness of the insulating film 41 is made at least as large as the thickness at which there is no inversion layer formed on the surface of the zener region 35 under the insulating film 41 at below the desired withstand voltage.

The differences in the features of the above-noted semiconductor device structure and the influence on the characteristics and the like are described below in contrast to the first embodiment of the present invention.

When the outer base region 33b and the inner base region 33a are not electrically connected at the base electrode 38, it is possible to approximately halve the width of the zener region 35, compared to the case in which they are connected. This is because there is no depletion layer formed between the outer base region 33 and the zener region 35.

Although in the foregoing description of the second embodiment, the given conductivity was taken as n type and the other conductivity was taken as p type for the case of an NPN transistor, application is also possible to the case of a PNP transistor in which the given conductivity is p type and the other conductivity is n type.

In the present invention, because a doped region of the zener diode is surrounded by the base region and because the surface part is covered by a base electrode with an intervening insulating film that has a thickness such that there is no inversion at a below the zener voltage, the influence of mobile ions in the oxide film and the outer resin material is suppressed, the control of the impurity concentration in the doped region of the zener diode is facilitated, and it is possible to obtain a transistor with a stabilized zener withstand voltage.

Additionally, by forming a phosphorus glass layer over the silicon oxide film, mobile ions are reliably trapped, enabling the achievement of a transistor with a stable withstand voltage.

What is claimed is:

1. A semiconductor device comprising:
   a collector region formed onto a surface of a semiconductor substrate having a first conductivity type,
   a base region of a second conductivity type formed in said collector region,
   an emitter region of said first conductivity type formed on a surface within said base region,
   a base electrode and an emitter electrode formed by opening windows in said base region and said emitter region, respectively,
   a zener region of said first conductivity type having an impurity concentration that is higher than an impurity concentration of said collector region, said zener region being provided in a through-passage region which separates said base into an outer base region and an inner base region, and
   an insulating film formed on said zener region and having a thickness such that said zener region surface does not invert at a voltage not exceeding a withstand voltage between said base region and said zener region,
   wherein said zener region is covered by said insulating film at said base electrode or said emitter electrode.

2. A semiconductor device according to claim 1, wherein said through-passage region is formed along a region near a boundary between said base region and said collector region, and formed so as to at least partially surround said emitter region.

3. A semiconductor device according to claim 2, wherein said through-passage region is divided into a plurality of sections, said sections extending in a direction parallel to said boundary.

4. A semiconductor device comprising:
   a collector region formed into a surface of a semiconductor substrate having a first conductivity type,
   a base region of a second conductivity type formed in said collector region,
   an emitter region of said first conductivity type formed on a surface within said base region,
   a base electrode and an emitter electrode formed by opening windows in said base region and said emitter regions, respectively,
   a through-passage region formed in said base region along a region near a boundary between said base region and said collector region so as to separate said base region into an inner base region and an outer base region and to extend from said surface to a bottom part,
   a zener region of said first conductivity type formed in said through-passage region with an impurity concentration that is higher than an impurity concentration of said semiconductor substrate, and
   an insulating film formed on said zener region and having a thickness such that said zener region surface does not invert at a voltage not exceeding a withstand voltage between said base region and said zener region,
       wherein the inner base region and the outer base region are electrically connected at said base electrode on said insulating film.

5. A semiconductor device according to claim 1, wherein the depth of said zener region is formed so as to be shallower than said base region.

6. A semiconductor device according to claim 1, wherein said insulating film is formed by a silicon oxide film and a phosphorus glass layer.

7. A semiconductor device according to claim 1, wherein a width of said through-passage region is selected so that a depletion layer that extends from said inner base region does not make contact with a depletion layer that extends from said outer base region.

8. A semiconductor device, comprising:
   a semiconductor substrate;
   a collector region disposed on said semiconductor substrate;
   a bas e region disposed on said collector region, said base region having a boundary with said collector region along peripheral portions of said base region; and a zener region, disposed within the base region substantially in parallel to the bound a,
wherein said zener region includes a plurality of separate portions that are not electrically connected.

9. A device according to claim 8, wherein said collector region has a first conductivity type, said base region has a second conductivity type, and said zener region has said first conductivity type with an impurity concentration that is higher than an impurity concentration of said collector region.

10. A device according to claim 8, wherein said base region has a depth that is greater than a depth of said zener region.

11. A device, according to claim 8, wherein said zener region partitions said base region into a plurality of portions that are not physically connected across said zener region.

12. A device, according to claim 11, wherein said zener region is a single continuous region that partitions said base region into an outer base portion and an inner base portion.

13. A device, according to claim 12, further comprising:
a base electrode, coupled to said inner base portion and said outer base portion.

14. A device according to claim 8, further comprising:
an emitter region disposed within said base region; an insulating film covering said zener region; and
an electrode covering said insulating film, wherein said electrode is one of: a base electrode and an emitter electrode.

15. A device according to claim 8, wherein said insulating film has a predetermined thickness sufficient to prevent the surface of said zener region from inverting within a predetermined withstand voltage between said zener region and said base region.

16. A device according to claim 8, wherein at least one of said base region and said zener region has a shape selected from the group consisting of: a square, a circle, an ellipse, and a square with rounded corners.

17. A semiconductor device, comprising:
means for providing a collector region on a semiconductor substrate;
means for providing a base region on the collector region;
means for providing a through-passage region in the base region substantially parallel to a boundary between the base region and the collector region; and
means for providing a zener region in the through-passage region, wherein said zener region includes a plurality of separate portions that are not electrically connected.

* * * * *